(12) United States Patent  
Park (10) Patent No.: US 8,378,948 B2
(45) Date of Patent: Feb. 19, 2013

(54) DRIVING CIRCUIT AND ORGANIC LIGHT EMITTING DIODE DISPLAY DEVICE INCLUDING THE SAME

(75) Inventor: Yong-sung Park, Suwon-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 1294 days.

(21) Appl. No.: 11/878,865

(22) Filed: Jul. 27, 2007

(65) Prior Publication Data

US 2008/0111839 A1 May 15, 2008

(30) Foreign Application Priority Data

Nov. 9, 2006 (KR) .................. 10-2006-0110574

(51) Int. Cl.
G09G 3/36 (2006.01)
(52) U.S. Cl. .......................................... 345/98; 345/76
(58) Field of Classification Search .............. 345/76–81, 345/98–100
See application file for complete search history.

(56) References Cited

U.S. PATENT DOCUMENTS

| | | | |
|---|---|---|---|
| 5,731,774 A | 3/1998 | Fujii et al. |
| 6,151,005 A | 11/2000 | Takita et al. |
| 6,310,593 B1 | 10/2001 | Nakao |
| 6,344,814 B1 | 2/2002 | Lin et al. |
| 6,369,783 B1 | 4/2002 | Kwon et al. |
| 6,441,758 B1 | 8/2002 | Koyama et al. |
| 6,469,647 B1 | 10/2002 | Kinugasa et al. |
| 6,570,520 B2 | 5/2003 | Ishii et al. |
| 6,781,532 B2 | 8/2004 | Wei |
| 6,781,536 B1 | 8/2004 | Martins |
| 7,006,027 B2 | 2/2006 | Lan et al. |
| 7,084,866 B2 | 8/2006 | Kobayashi |
| 7,236,422 B2 | 6/2007 | Kageyama et al. |
| 7,268,763 B2 | 9/2007 | Fukuda et al. |
| 7,369,075 B2 | 5/2008 | Ishii et al. |
| 2002/0041266 A1 | 4/2002 | Koyama et al. |
| 2003/0132907 A1 | 7/2003 | Lee et al. |
| 2004/0104872 A1 | 6/2004 | Kang et al. |
| 2004/0174355 A1 | 9/2004 | Taguchi et al. |

(Continued)

FOREIGN PATENT DOCUMENTS

| | | |
|---|---|---|
| CN | 1300046 A | 6/2001 |
| CN | 1432989 A | 7/2003 |

(Continued)

OTHER PUBLICATIONS

Matsueda, Y., et al., "35.1: 2.5-in. AMOLED with Integrated 6-Bit Gamma Compensated Digital Data Driver", 2004 SID International Symposium, Seattle, WA US, SID 04 Digest, pp. 1116-1119, (May 25-27, 2004).

(Continued)

Primary Examiner — Michael Pervan
(74) Attorney, Agent, or Firm — Lee & Morse, P.C.

(57) ABSTRACT

A driving circuit includes a first decoder for outputting first decoding signals, a first selection unit for generating selection signals and first inverse selection signals, a switch unit for selecting a first reference voltage and a second reference voltage, the second reference voltage being lower than the first reference voltage, a second decoder for outputting second decoding signals, a second selection unit for generating second selection signals second inverse selection signals, and voltage distribution units adapted to receive and distribute the selected first reference voltage and the selected second reference voltage.

17 Claims, 7 Drawing Sheets

U.S. PATENT DOCUMENTS

| | | |
|---|---|---|
| 2004/0217892 A1 | 11/2004 | Hu et al. |
| 2005/0007315 A1 | 1/2005 | Yang et al. |
| 2005/0057549 A1 | 3/2005 | Tachibana et al. |
| 2005/0168416 A1* | 8/2005 | Hashimoto et al. ............ 345/76 |
| 2005/0207249 A1 | 9/2005 | Morita |
| 2006/0214900 A1 | 9/2006 | Tsuchi et al. |
| 2006/0232450 A1 | 10/2006 | Hashido et al. |
| 2007/0139313 A1 | 6/2007 | Choi |

FOREIGN PATENT DOCUMENTS

| | | |
|---|---|---|
| EP | 0 911 677 | 4/1999 |
| EP | 1 182 636 A2 | 2/2002 |
| EP | 1 300 826 A2 | 4/2003 |
| EP | 1 517 448 A1 | 3/2005 |
| EP | 1 675 096 A1 | 6/2006 |
| GB | 2 329 772 A | 3/1999 |
| GB | 2 380 848 A | 4/2003 |
| JP | 58-196722 A | 11/1983 |
| JP | 62-024713 A | 2/1987 |
| JP | 02-246424 A | 10/1990 |
| JP | 06-077832 A | 3/1994 |
| JP | 06-268523 A | 9/1994 |
| JP | 06-348236 A | 12/1994 |
| JP | 11-296147 A | 10/1999 |
| JP | 2000-036749 A | 2/2000 |
| JP | 2000-138586 A | 5/2000 |
| JP | 2002-076897 A | 3/2002 |
| JP | 2002-149131 | 5/2002 |
| JP | 2002-314421 A | 10/2002 |
| JP | 2003-273739 A | 9/2003 |
| JP | 2004-163456 A | 6/2004 |
| JP | 2004-295103 A | 10/2004 |
| JP | 2005-070673 | 3/2005 |
| JP | 2006-197532 A | 7/2006 |
| JP | 2006-311591 A | 11/2006 |
| JP | 2007-171918 A | 7/2007 |
| KR | 1999-013254 | 2/1999 |
| KR | 10-2004-0044529 | 5/2004 |
| KR | 10-2005-0007658 A | 1/2005 |
| KR | 10-2006-0023305 | 3/2006 |
| KR | 10-2006-0056862 A | 5/2006 |
| KR | 10-2006-0112984 A | 11/2006 |

OTHER PUBLICATIONS

Chinese Certificate of Patent for Innovation in CN 101178873 B, dated Jun. 15, 2011, with English Translation.

* cited by examiner

DRIVING CIRCUIT AND ORGANIC LIGHT EMITTING DIODE DISPLAY DEVICE INCLUDING THE SAME

BACKGROUND OF THE INVENTION

1. Field of the Invention

The present embodiments relate to a driving circuit and an organic light emitting diode (OLED) display device. More particularly, the present embodiments relate to a driving circuit capable of reducing a grey level error by preventing voltage sag, caused in an analog switch, to improve its linearity, and an OLED display device including the same.

2. Description of the Related Art

A flat panel display may include a display region in which pixels are arranged in an array on a substrate. An image may be displayed by connecting scan lines and data lines to each of the pixels to selectively apply a data signal to the pixels.

Flat panel displays may be classified into passive matrix type displays and active matrix type displays, depending on driving systems of pixels. Active matrix type displays, which selectively illuminate every unit pixel, have been widely used for favorable aspects of, e.g., resolution, contrast, response time, etc.

Flat panel displays have been used as displays or monitors for information appliances, e.g., personal computers, mobile phones, PDAs, etc. The flat panel displays may be classified into, e.g., LCD displays using liquid crystal panels, OLED display devices, PDPs using plasma panels, etc.

Recent years have witnessed the development of various light emitting diode display devices which have light weight and are small-sized when compared to cathode ray tube devices. In particular, organic electro luminescent displays having excellent luminous efficiency, luminance, viewing angle and rapid response time have stood in the spotlight.

SUMMARY OF THE INVENTION

The present embodiments are therefore directed to a driving circuit capable of displaying various grey level values, and an OLED display device including the same.

It is therefore a feature of an embodiment to provide a driving circuit capable of reducing a grey level error by preventing voltage sag.

It is therefore another feature of an embodiment to provide a driving circuit having improved linearity.

At least one of the above and other features and advantages of the present embodiments may be realized by providing a circuit, which may include a first decoder adapted to output first decoding signals employing first bits of a digital data signal, a first selection unit adapted to generate first selection signals and first inverse selection signals in correspondence with the first decoding signals, a switch unit adapted to select a first reference voltage and second reference voltage from reference voltages employing the first selection signals and the first inverse selection signals, the second reference voltage being lower than the first reference voltage, a second decoder adapted to output second decoding signals employing second bits of the digital data signal, a second selection unit adapted to generate second selection signals and second inverse selection signals in correspondence with the second decoding signals, and voltage distribution units adapted to receive and distribute the selected first reference voltage and the selected second reference voltage, where a voltage distribution unit may include a data voltage generation unit adapted to receive the second selection signals and the second inverse selection signals to generate a data voltage.

The first selection unit may be adapted to operate in correspondence with one bit of the digital data signal. The second selection unit may be adapted to operate in correspondence with one bit of the digital data signal. The first decoder may be adapted to select two reference voltages. The data voltage generation unit may include a voltage distribution unit adapted to receive the first reference voltage and the second reference voltage to generate four grey level voltages by employing a resistance ratio. The switch unit may include a first transistor adapted to receive the first selection signal and switch the first reference voltage, a second transistor adapted to receive the first inverse selection signal and switch the first reference voltage, a third transistor adapted to receive the first selection signal and switch the second reference voltage, and a fourth transistor adapted to receive the first inverse selection signal and switch the second reference voltage. The data voltage generation may include a fifth transistor adapted to switch the first reference voltage in correspondence with the second selection signal, a sixth transistor adapted to switch the first reference voltage in correspondence with the second inverse selection signal, a resistor array in which first, second, and third resistors are connected in series, a seventh transistor connected between the first and second resistors, the seventh transistor being adapted to output a grey level voltage of the data signal in correspondence with the second selection signal, and an eighth transistor connected between the second and third resistor and adapted to output a grey level voltage of the data signal in correspondence with the second inverse selection signal. The switch unit may be adapted to select two reference voltage lines from nine reference voltage lines to select the first reference voltage and the second reference voltage.

At least one of the above and other features and advantages of the present embodiments may be realized by providing a data driver which may include a shift register unit adapted to output control signals, a latch unit adapted to receive digital data signals in series and to output digital data signals in parallel in correspondence with the control signal, and a D/A converter unit adapted to convert the digital data signal to a data voltage, where the D/A converter unit may include a first decoder adapted to output first decoding signals employing first bits of a digital data signal, a first selection unit adapted to generate first selection signals and first inverse selection signals in correspondence with the first decoding signals, a switch unit adapted to select a first reference voltage and second reference voltage from reference voltages employing the first selection signals and the first inverse selection signals, the second reference voltage being lower than the first reference voltage, a second decoder adapted to output second decoding signals employing second bits of the digital data signal, a second selection unit adapted to generate second selection signals and second inverse selection signals in correspondence with the second decoding signals, and voltage distribution units adapted to receive and distribute the selected first reference voltage and the selected second reference voltage, where a voltage distribution unit may include a data voltage generation unit adapted to receive the second selection signals and the second inverse selection signals to generate a data voltage.

At least one of the above and other features and advantages of the present embodiments may be realized by providing an OLED, which may include a pixel unit adapted to receive a data voltage and a scan signal to display an image, a data driver adapted to generate the data voltage, and a scan driver adapted to generate the scan signal, where the data driver may include a shift register unit adapted to output control signals, a latch unit adapted to receive digital data signals in series and output digital data signals in parallel in correspondence with the control signal, and a D/A converter unit adapted to convert a digital data signal to data voltage, where the D/A converter unit may include a first decoder adapted to output first decoding signals employing first bits of a digital data signal, a first selection unit adapted to generate first selection signals and first inverse selection signals in correspondence with the first decoding signals, a switch unit adapted to select a first reference voltage and second reference voltage from reference voltages employing the first selection signals and the first inverse selection signals, the second reference voltage being lower than the first reference voltage, a second decoder adapted to output second decoding signals employing second bits of the digital data signal, a second selection unit adapted to generate second selection signals and second inverse selection signals in correspondence with the second decoding signals, and voltage distribution units adapted to receive and distribute the selected first reference voltage and the selected second reference voltage, where a voltage distribution unit may include a data voltage generation unit adapted to receive the second selection signals and the second inverse selection signals to generate a data voltage.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Korean Patent Application No. 10-2006-0110574, filed on Nov. 9, 2006, in the Korean Intellectual Property Office, and entitled: "Driving Circuit and Organic Light Emitting Diode Display Device Thereof," is incorporated by reference herein in its entirety.

The present embodiments will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

When one element is connected to another element, one element may be not only directly connected to another element but also indirectly connected to another element via another element. Further, elements may be omitted for clarity. Also, like reference numerals refer to like elements throughout.

Figure 1:
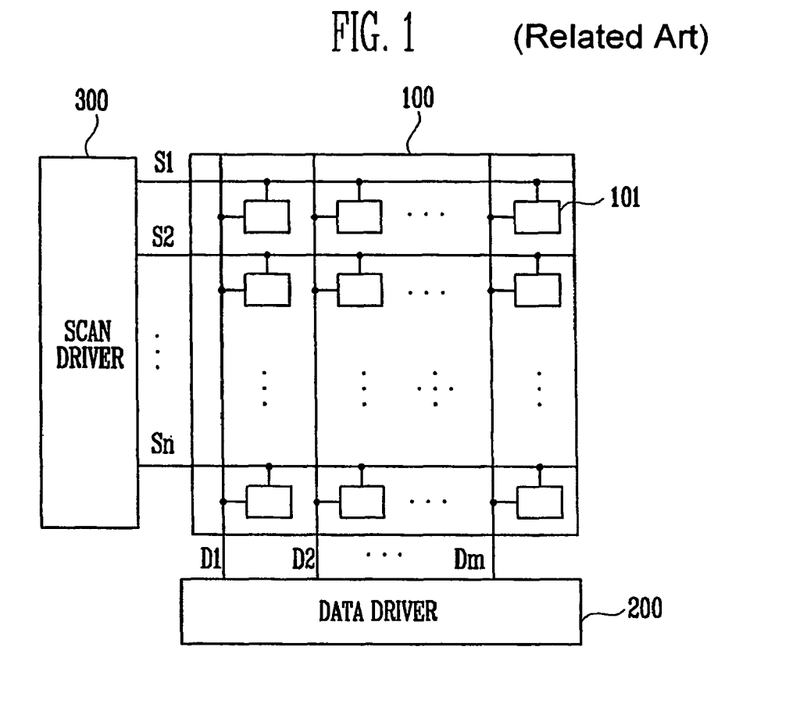
FIG. 1 illustrates an OLED display device.

FIG. 1 illustrates a cross-sectional view of an OLED display device. Referring to FIG. 1, the OLED display device may include a pixel unit 100, a data driver 200 and a scan driver 300.

The pixel unit 100 may include multiple data lines (D1, D2 . . . Dm-1, Dm) and multiple scan lines (S1, S2 . . . Sn-1, Sn), and also may include multiple pixels 101 formed in a region defined by the data lines (D1, D2 . . . Dm-1, Dm) and the scan lines (S1, S2 . . . Sn-1, Sn). Each pixel 101 may include a pixel circuit and an OLED, and may generate a pixel current flowing to the OLED. The pixel current may be applied to the pixels by employing a data signal transmitted to the pixel circuit through the data lines (D1, D2 . . . Dm-1, Dm), and a scan signal transmitted to the pixel circuit through the scan lines (S1, S2 . . . Sn-1, Sn).

The data driver 200 may be connected to the data lines (D1, D2 . . . Dm-1, Dm), and may generate a data signal sequentially transmitted to rows of the data lines (D1, D2 . . . Dm-1, Dm). The data driver 200 may include a D/A converter to generate a grey level voltage, and may transmit the generated grey level voltage to the data lines (D1, D2 . . . Dm-1, Dm), the grey level voltage converting the digital signal into an analog signal.

The scan driver 300 may be connected to the scan lines (S1, S2 . . . Sn-1, Sn), and may generate a scan signal transmitted to the scan lines (S1, S2 . . . Sn-1, Sn). A certain row may be selected by the scan signal, and the data signal may be transmitted to the pixel 101 in the selected row, and the pixel may thus generate an electric current corresponding to the data signal.

Figure 2:
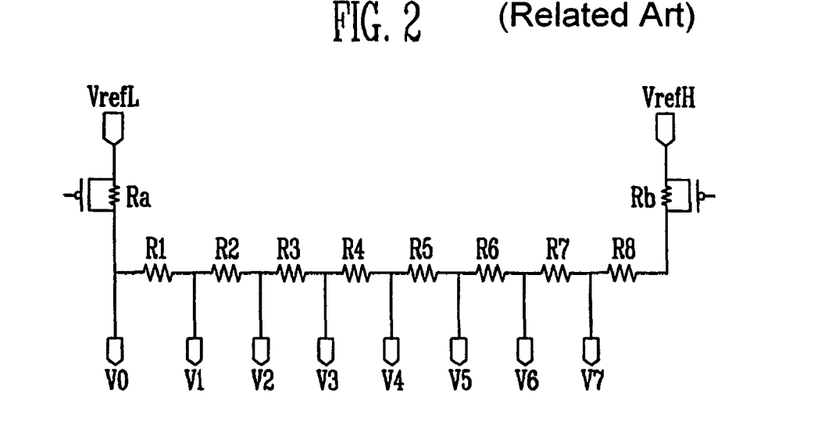
FIG. 2 illustrates a circuit view of a resistor array for generating a grey level voltage in a D/A converter used in a data driver of the OLED display device of FIG. 1.

FIG. 2 illustrates a circuit view of a resistor unit for generating a grey level voltage in a D/A converter used in a data driver of the OLED display device of FIG. 1. Referring to FIG. 2, the resistor unit may generate 8 grey level voltages V0, V1 . . . V6, V7. Eight resistors R1, R2 . . . R7, R8 may be connected in series to generate the 8 grey level voltages, and a first reference voltage VrefH, which may be a high voltage, and a second reference voltage VrefL, which may be a low voltage, may be transmitted to ends of the resistors R1, R2 . . . R7, R8 connected in series. VrefL and VrefH may be transmitted to the unit via transistors having internal resistances Ra and Rb, respectively. Voltages may be distributed by the 8 resistors R1, R2 . . . R7, R8 as data voltages.

The D/A converter as configured above may generate 8 data voltages distributed by the 8 resistors R1, R2 . . . R7, R8. Grey levels to be generated may be fixed since the number of the distributed data voltages are fixed, and therefore the D/A converter may be designed differently if the data signal displays 256 grey levels, 128 grey levels or 64 grey levels. Accordingly, different data drivers may be used if different numbers of grey levels are displayed, and different data drivers may be employed depending on the grey levels of the data signal.

Figure 3:
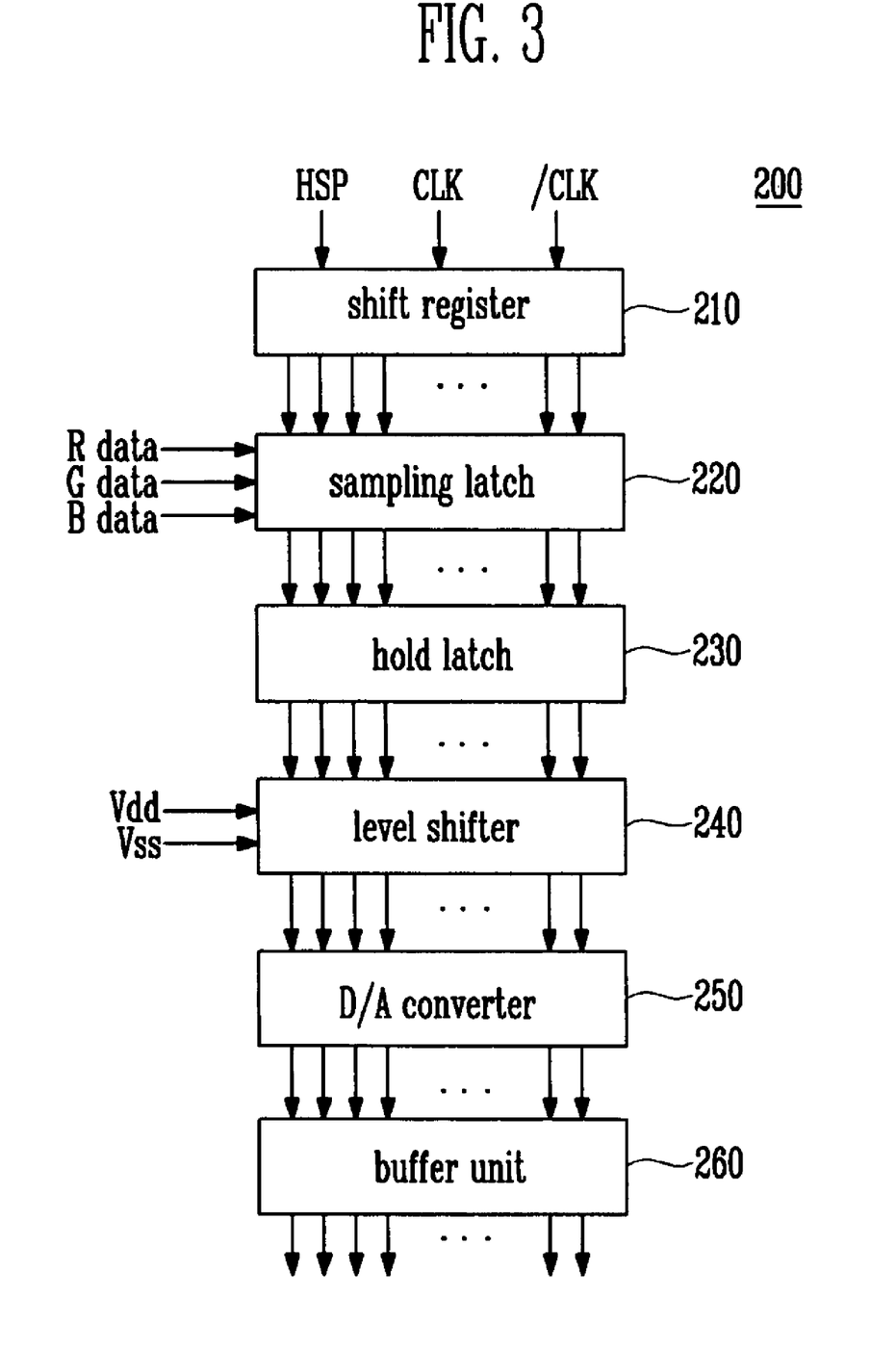
FIG. 3 illustrates a data driver used in an OLED display device according to the present embodiments.

FIG. 3 illustrates a cross-sectional view of a data driver 200 of an OLED display device according to the present embodiments. Referring to FIG. 3, the data driver 200 may include a shift register 210, a sampling latch 220, a hold latch 230, a level shifter 240, a D/A converter 250 and a buffer unit 260.

The shift register 210 may include multiple flip flops, and may control the sampling latch 220 in correspondence with a clock signal (CLK or/CLK) and a synchronizing signal (HSP). The sampling latch 220 may sequentially receive data signals (R data, G data, and B data) of one row and output the received data signals in parallel, depending on a control signal of the shift register 210. A process in which the signals are sequentially received and output in parallel is referred to as SIPO (Serial In Parallel Out). The hold latch 230 may receive signals in parallel and output the received signals in parallel. A process in which the signals are received in parallel and output in parallel is referred to as PIPO (Parallel In Parallel Out). The level shifter 240 (employing a high potential voltage Vdd and a low potential voltage Vss) may convert the signals, output from the hold latch 230, to an operation voltage of the system, and may transmit the converted signals to the D/A converter 250. The D/A converter 250 may convert the digital signal to an analog signal, may select a corresponding grey level voltage, and may transmit the selected grey level voltage to the buffer unit 260. The buffer unit 260 may amplify the grey level voltage to transmit the amplified grey level voltage.

Figure 4:
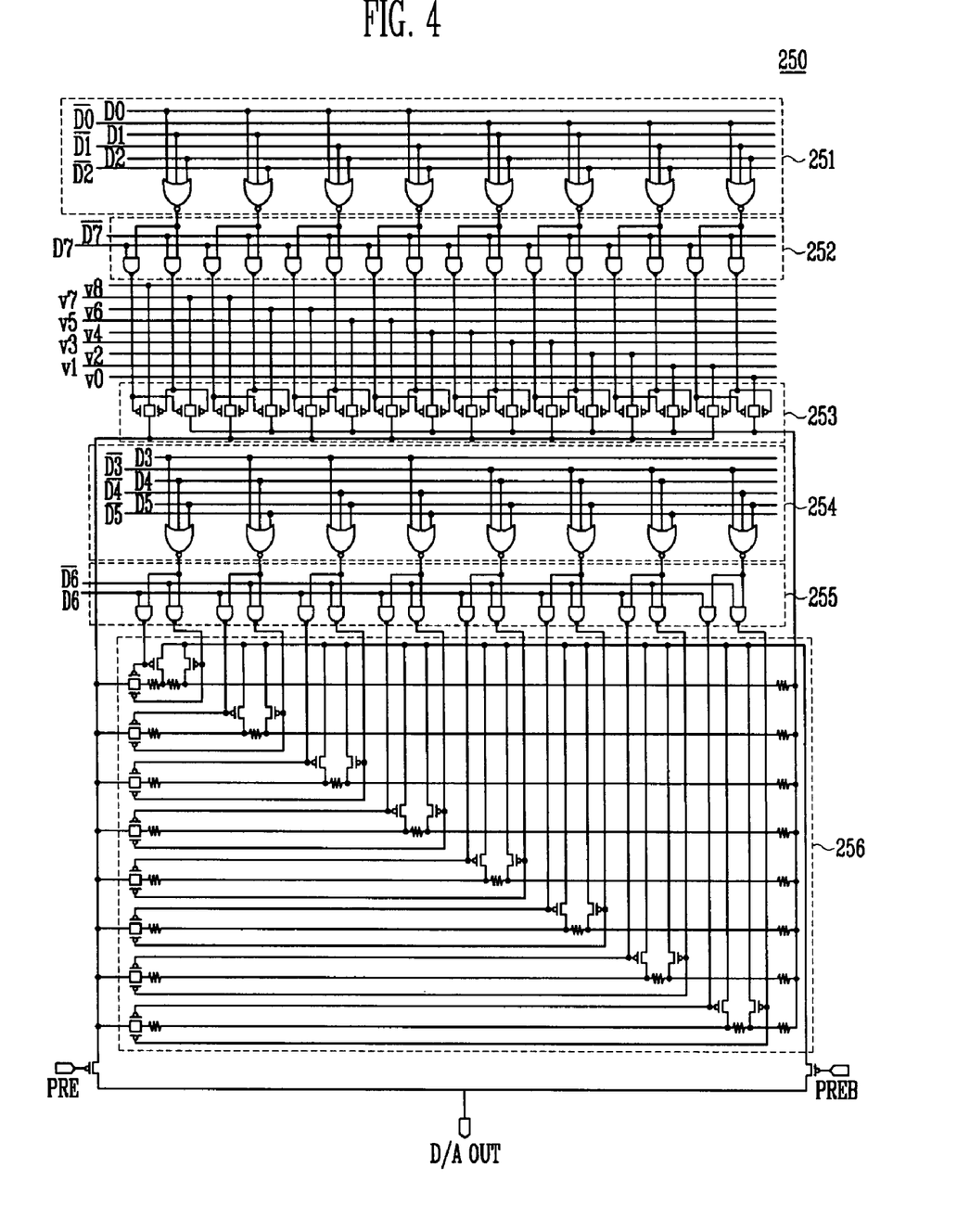
FIG. 4 illustrates a D/A converter according to the present embodiments.

FIG. 4 illustrates a D/A converter. Referring to FIG. 4, the D/A converter 250 may include a first decoder 251, a first selection unit 252, a switch unit 253, a second decoder 254, a second selection unit 255 and a data voltage generation unit 256. When the D/A converter 250 generates one of, e.g., 64 grey levels, 128 grey levels, 256 grey levels, etc., the data signal transmitted from the D/A converter may be, e.g., a 6-bit signal, a 7-bit signal, an 8-bit signal, etc.

The first decoder 251 may employ an upper, i.e., first, 3 bits of the data signals to generate 8 first decoding signals. The first decoder 251 may include 8 NOR gates, and may employ the upper 3-bit signals and their bar, i.e., inverse, signals applied to data lines D0, D1, D2, $\overline{D0}$, $\overline{D1}$, $\overline{D2}$ to generate 8 first decoding signals, and then may select one NOR gate out of the 8 NOR gates to output the first decoding signal. For convenience, the leftmost NOR gate is referred to as a first NOR gate, the next NOR gate is referred to as a second NOR gate, etc.

The first selection unit 252 may include multiple NAND gates having two input terminals, and may generate 8 first selection signals and 8 first selection bar signals. There may be a total of 16 NAND gates, and when two of the NAND gates form a pair, the result may be a total of 8 pairs of the NAND gates. For convenience, two of the leftmost NAND gates forming a pair are referred to as a first NAND gate pair, the next two are referred to as a second NAND gate pair, etc. High and low signals may be applied to data lines D7 and $\overline{D7}$ to drive the NAND gates in conjunction with the signals output from the first decoder 251.

An output terminal of the first NOR gate may be connected to one input terminal of the first NAND gate to receive a first decoding signal, and a positive signal line may be connected to the other input terminal of the first NAND gate. The output terminal of the first NOR gate may also be connected to one input terminal of the second NAND gate to receive a first decoding signal, and a negative signal line may be connected to the other input terminal of the second NAND gate. A first selection signal may be output from the first NAND gate, and a first selection bar signal may be output from the second NAND gate. One bit of the data signal may be transmitted to the positive signal line, and a bar signal of one bit of the data signal may be transmitted to the negative signal line. That is, a signal of "1" may be transmitted by the positive signal line, and a signal of "0" may be transmitted by the negative signal line. When the data signal is an 8-bit signal, a signal of the lowermost bit out of the 8-bit signal(D7,$\overline{D7}$) may be transmitted When the data signal is a 7-bit signal or a 6-bit signal, a signal of "1" may be transmitted.

The switch unit 253 may select two reference voltage lines out of the total 9 reference voltage lines (V0, V1 ... V8) to select a first reference voltage and a second reference voltage out of the reference voltages, the second reference voltage being lower than the first reference voltage. The switch unit 253 may include a total of 32 transistors, the 32 transistors paired to form 16 pairs. The transistors forming one leftmost pair are referred to as a first transistor and a second transistor, the transistors forming the next pair are referred to as a third transistor and a fourth transistor, etc.

The two transistors forming a pair may each have sources connected to one reference voltage line out of the 9 reference voltage lines, and gates connected respectively to a first NAND gate and a second NAND gate of a NAND gate pair. Accordingly, when the first selection signal is output through the first NAND gate, the first transistor and the third transistor may be in a turned-on state, and the first reference voltage and the second reference voltage may be selected and transmitted to the data voltage generation unit. When the second selection signal is output through the second NAND gate, the second transistor and the fourth transistor may be in a turned-on state, and the first reference voltage and the second reference voltage may be selected and transmitted to the data voltage generation unit.

The second decoder 254 may employ a lower, i.e., second, 3 bits of the data signals to generate 8 second decoding signals. The second decoder 254 may include 8 NOR gates, and may employ the lower 3-bit signals of the data signal and their bar signals through data lines D3, D4, D5, $\overline{D3}$, $\overline{D4}$, $\overline{D5}$ to generate 8 second decoding signals, and one NOR gate out of the 8 NOR gates may output the second decoding signal. For convenience, the leftmost NOR gate is referred to as a ninth NOR gate, the next NOR gate, is referred to as the tenth NOR gate, etc.

The second selection unit 255 may include multiple NAND gates having two input terminals, and may generate 8 second selection signals and 8 second selection bar signals. There may be a total 16 NAND gates, with two of the NAND gates forming a pair, resulting in a total of 8 pairs of the NAND gates. For convenience, two of the leftmost NAND gates becoming a pair are referred to as a seventeenth NAND gate and an eighteenth NAND gate, etc. High and low signals may be applied to data lines D6 and $\overline{D6}$ to drive the NAND gates in conjunction with the signals output from the second decoder 254.

An output terminal of the ninth NOR gate may be connected to one input terminal of the seventeenth NAND gate to receive a second decoding signal, and a positive signal line may be connected to the other input terminal of the seventeenth NAND gate. The output terminal of the ninth NOR gate may also be connected to one input terminal of the eighteenth NAND gate to receive a second decoding signal, and a negative signal line may be connected to the other input terminal of the eighteenth NAND gate. A second selection signal may be output from the seventeenth NAND gate, and a second selection bar signal may be output from the eighteenth NAND gate. One bit of the data signal may be transmitted by data line D6, and a bar signal of one bit of the data signal may be transmitted by the positive signal line. That is, a signal of "1" may be transmitted by data line the positive signal line, and a signal of "0" may be transmitted by the negative signal line. When the $\overline{data}$ signal is an 8-bit signal, a lower 2-bit signal(D6,$\overline{D6}$) out of the 8-bit signals may be transmitted. When the data signal is a 7-bit signal, a signal of the lowermost bit out of the 7-bit signals may be transmitted. When the data signal is a 6-bit signal, a signal of "1" may be transmitted.

The data voltage generation unit 256 may include 8 voltage distribution units, and each of the voltage distribution units may include resistor arrays which may contain 4 transistors and 3 resistors. Two transistors out of the 4 transistors may receive the first reference voltage through the source, and may have a drain connected to one terminal of the resistor array. The two transistors may have a gate connected respectively to the seventeenth NAND gate and the eighteenth NAND gate.

The two remaining transistors may have a source connected respectively to both ends of the resistor arranged in a central region of the 3 resistor array, a drain connected to an output terminal, and a gate connected respectively to the seventeenth NAND gate and the eighteenth NAND gate.

The transistors may be connected respectively to output lines, and the transistors may be driven by a preset signal PRE and a preset bar signal PREB. The analog signal may be output at D/A out.

The selection of the first reference voltage VrefH and the second reference voltage VrefL may be displayed with 8 or 16 grey levels by the first decoder 251 and the first selection unit 252. The grey level voltage may also be selected with 8 or 16 grey levels by the second decoder 254 and the second selection unit 255. Therefore, it may be possible to display 64 grey levels, 128 grey levels, or 256 grey levels.

Figure 5:
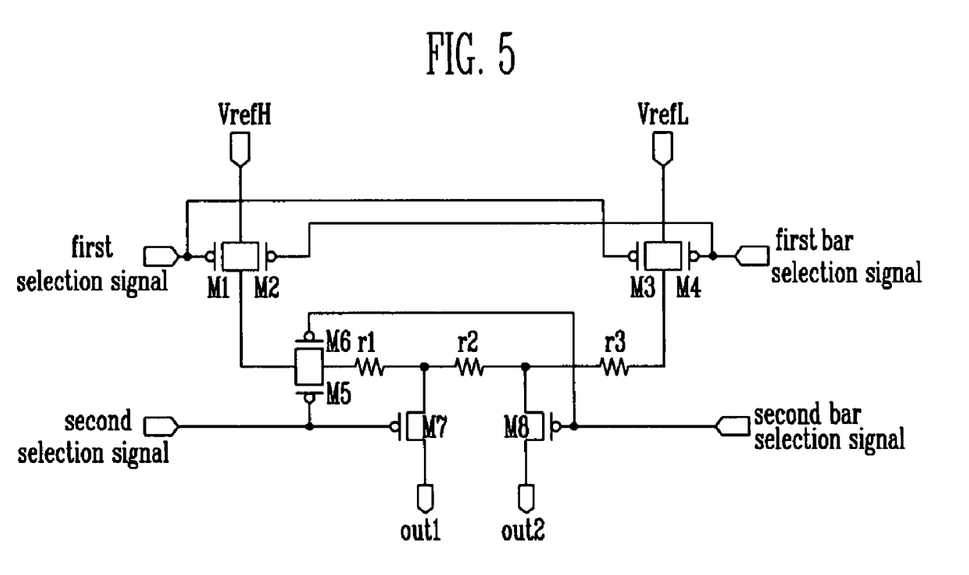
FIG. 5 illustrates a circuit view of a voltage distribution circuit for generating a grey level voltage, which is connected to a first selection unit in the D/A converter according to the present embodiments.

FIG. 5 illustrates a circuit view of a data voltage generation circuit that may be connected to a switch unit in the D/A converter according to the present embodiments. Referring to FIG. 5, the data voltage generation circuit may include a first transistor M1 and a second transistor M2 for switching a first reference voltage VrefH. A third transistor M3 and a fourth transistor M4 may switch a second reference voltage VrefL. The data voltage generation circuit may include a fifth transistor M5 and a sixth transistor M6 adapted to further switch the first reference voltage VrefH. A resistor array may include first, second, and third resistors r1, r2, r3 connected in series. A seventh transistor M7 may connect between the first resistor r1 and the second resistor r2 to transmit signals to a first output terminal out1. An eighth transistor M8 may connect between the second resistor r2 and the third resistor r3 to transmit signals to a second output terminal out2. An internal resistance of the first transistor M1 may be referred to as Ra', an internal resistance of the second transistor M2 may be referred to as Rb', an internal resistance of the third transistor M3 may be referred to as Rc, an internal resistance of the fourth transistor M4 may be referred to as Rd, an internal resistance of the fifth transistor M5 may be referred to as Re, and an internal resistance of the sixth transistor M6 may be referred to as Rf.

Figure 6:
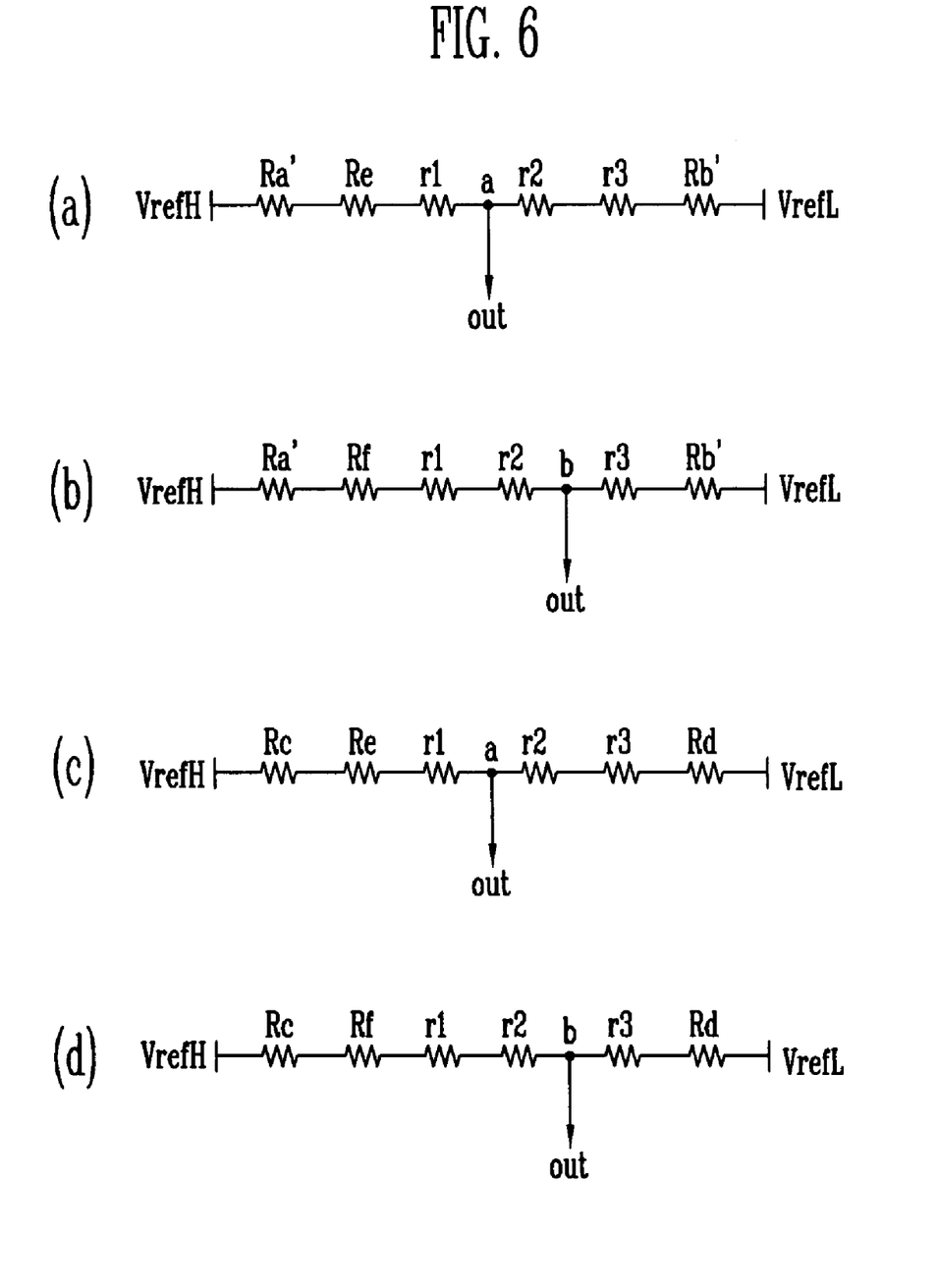
FIG. 6 illustrates an equivalent circuit view of a resistor array for generating a grey level voltage.

The first transistor M1 and the third transistor M3 may be controlled by the first selection signal. The second transistor M2 and the fourth transistor M4 may be controlled by the first selection bar signal. The fifth transistor M5 and the seventh transistor M7 may be controlled by the second selection signal. The sixth transistor M6 and the eighth transistor M8 may be controlled by the second selection bar signal. The data voltage generation circuit may employ at least one of four resistor arrays depending on a switching operation of each of the transistors, as shown in FIG. 6. Four grey level voltages may be output by employing the first reference voltage VrefH and the second reference voltage VrefL in accordance with a resistance ratio.

Accordingly, 8 voltage distribution circuits may generate a total of 32 grey level voltages, because 4 grey level voltages may be generated in one data voltage generation unit.

Figure 7:
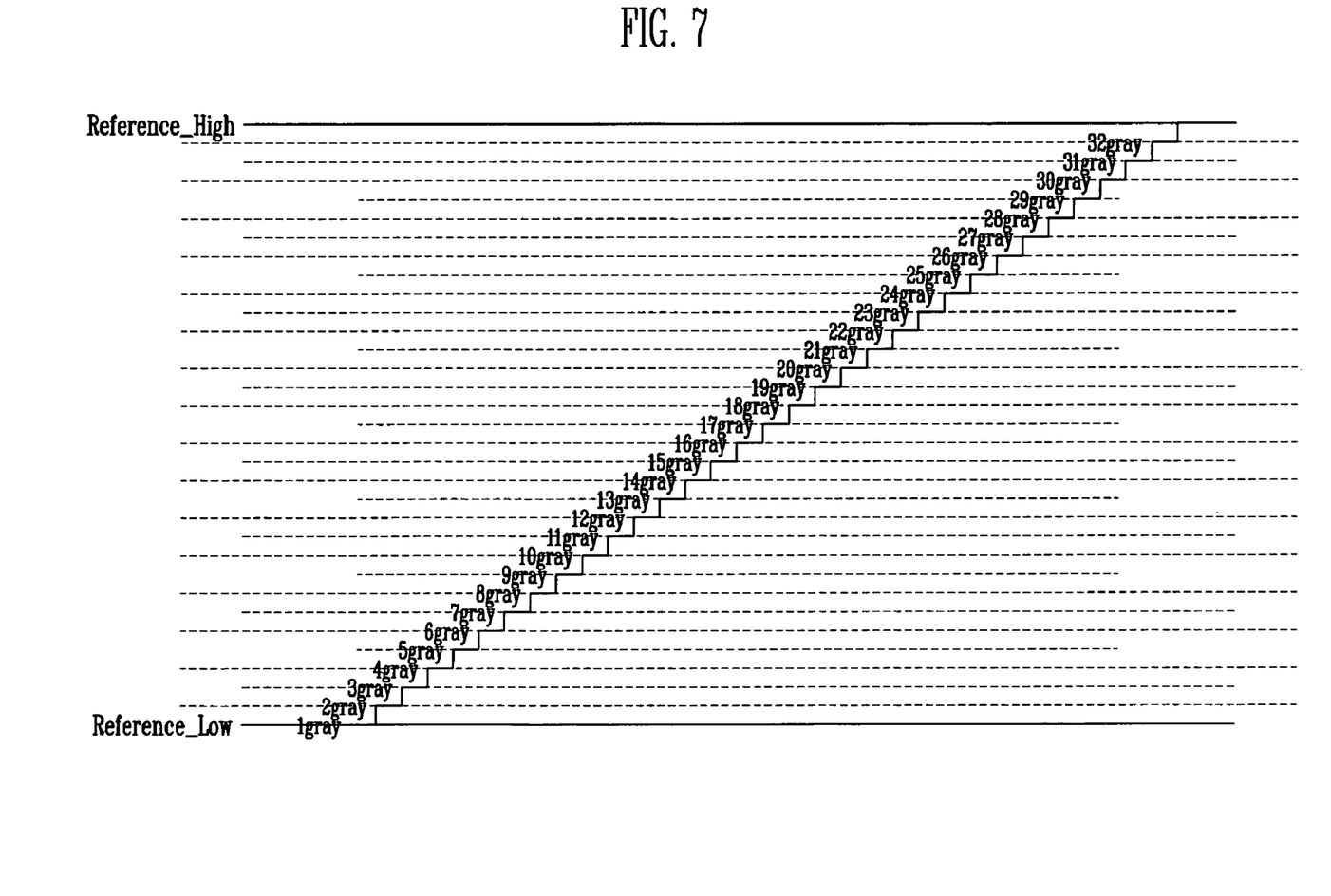
FIG. 7 illustrates a diagram of a grey level voltage that is generated in a voltage distribution unit and a first selection unit as shown in FIG. 5.

FIG. 7 illustrates a diagram of a grey level voltage generated in a voltage distribution unit and the first selection unit as shown in FIG. 5. Referring to FIG. 7, when the first reference voltage and the second reference voltage are selected, the first grey level voltage and the second grey level voltage may be divided into 16 levels and define an intermediate value in each step to generate the total of 32 grey level voltages. When the data signal is composed of 6 bits, the data signal may be initially divided into 16 grey levels to generate 16 grey level voltages. When the data signal is composed of 7 bits or 8 bits, the data signal may generate the entire 32 grey level voltages.

Figure 8:
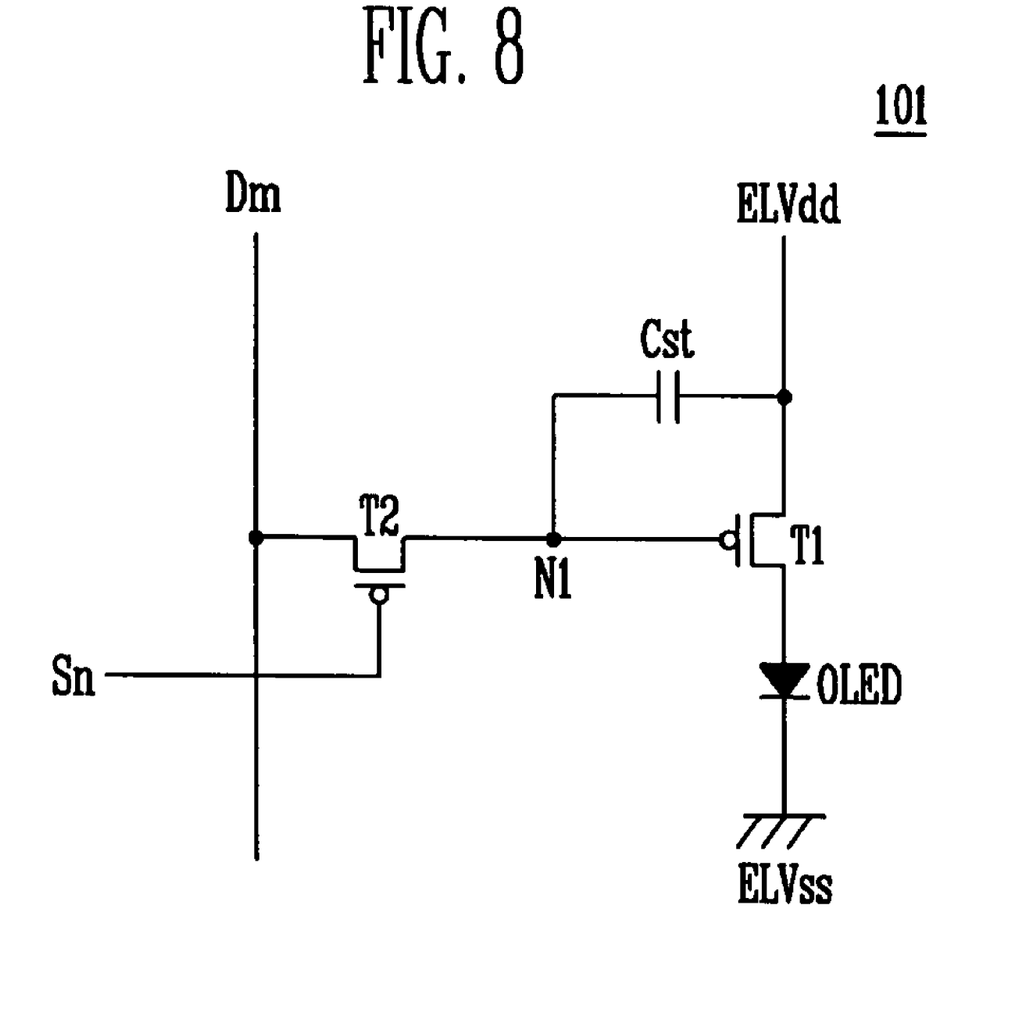
FIG. 8 illustrates a circuit view of a pixel used in the OLED display device of FIG. 2.

FIG. 8 illustrates a circuit view of one example of a pixel circuit employed in the OLED display device of FIG. 2. Referring to FIG. 8, the pixel circuit may be connected to the data line Dm, the scan line Sn and a pixel power line ELVdd, and may include a first transistor T1, a second transistor T2, a capacitor Cst, and an OLED connected to a power source ELVss.

The first transistor T1 may have a source connected to a pixel power line ELVdd, a drain connected to the OLED, and a gate connected to a first node N1. The second transistor T2 may have a source connected to the data line Dm, a drain connected to the first node N1, a gate connected to the scan line Sn. The capacitor Cst may be connected between the first node N1 and the pixel power line ELVdd to maintain a voltage between the first node N1 and the pixel power line ELVdd for a predetermined time. The OLED may include an anode electrode, a cathode electrode and a light emitting layer. The anode electrode may be connected to the drain of the first transistor T1, and the cathode electrode may be connected to the power source ELVss having a low electric potential. Therefore, light may be emitted in the light emitting layer and brightness controlled, in correspondence with an electric current capacity, when electric current flows from the anode electrode to the cathode electrode of the OLED in correspondence with a voltage applied to the gate of the first transistor T1.

The driving circuit according to the present embodiments and the OLED display device thereof may be used in various OLED display devices by converting a digital data signal to an analog data signal to suitably correspond to the bit number of the data signal.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present embodiments as set forth in the following claims.

What is claimed is:

1. A circuit, comprising:
   a first decoder adapted to output a plurality of first decoding signals employing first bits of a digital data signal;
   a first selection unit adapted to generate a plurality of first selection signals and a plurality of first inverse selection signals in correspondence with the first decoding signals;
   a switch unit adapted to select a first reference voltage and second reference voltage from a plurality of reference voltages employing the first selection signals and the first inverse selection signals, the second reference voltage being lower than the first reference voltage;
   a second decoder adapted to output a plurality of second decoding signals employing second bits of the digital data signal;
   a second selection unit adapted to generate a plurality of second selection signals and a plurality of second inverse selection signals in correspondence with the second decoding signals; and
   a plurality of voltage distribution units adapted to receive and distribute the selected first reference voltage and the selected second reference voltage, wherein a voltage distribution unit includes a data voltage generation unit adapted to receive the second selection signals and the second inverse selection signals to generate a data voltage, wherein the switch unit includes:
a first transistor adapted to receive a first selection signal and switch the first reference voltage;
a second transistor adapted to receive a first inverse selection signal and switch the first reference voltage;
a third transistor adapted to receive the first selection signal and switch the second reference voltage; and
a fourth transistor adapted to receive the first inverse selection signal and switch the second reference voltage.

2. The circuit as claimed in claim 1, wherein the first selection unit is adapted to operate in correspondence with one bit of the digital data signal.

3. The circuit as claimed in claim 1, wherein the second selection unit is adapted to operate in correspondence with one bit of the digital data signal.

4. The circuit as claimed in claim 1, wherein the first decoder is adapted to select two reference voltages.

5. The circuit as claimed in claim 1, wherein the data voltage generation unit includes a voltage distribution unit adapted to receive the first reference voltage and the second reference voltage to generate four grey level voltages by employing a resistance ratio.

6. The circuit as claimed in claim 1, wherein the data voltage generation unit comprises:
a fifth transistor adapted to switch the first reference voltage in correspondence with the second selection signal;
a sixth transistor adapted to switch the first reference voltage in correspondence with the second inverse selection signal;
a resistor array in which first, second, and third resistors are connected in series;
a seventh transistor connected between the first and second resistors and adapted to output a grey level voltage of the data signal in correspondence with the second selection signal; and
an eighth transistor connected between the second and third resistor and adapted to output a grey level voltage of the data signal in correspondence with the second inverse selection signal.

7. The circuit as claimed in claim 1, wherein the switch unit is adapted to select two reference voltage lines from nine reference voltage lines to select the first reference voltage and the second reference voltage.

8. A data driver, comprising:
a shift register unit adapted to output control signals;
a latch unit adapted to receive digital data signals in series and output digital data signals in parallel in correspondence with the control signal; and
a D/A converter unit adapted to convert a digital data signal to a data voltage,
wherein the D/A converter unit includes:
a first decoder adapted to output a plurality of first decoding signals employing first bits of a digital data signal;
a first selection unit adapted to generate a plurality of first selection signals and a plurality of first inverse selection signals in correspondence with the first decoding signals;
a switch unit adapted to select a first reference voltage and second reference voltage from a plurality of reference voltages employing the first selection signals and the first inverse selection signals, the second reference voltage being lower than the first reference voltage;
a second decoder adapted to output a plurality of second decoding signals employing second bits of the digital data signal;
a second selection unit adapted to generate a plurality of second selection signals and a plurality of second inverse selection signals in correspondence with the second decoding signals; and
a plurality of voltage distribution units adapted to receive and distribute the selected first reference voltage and the selected second reference voltage,
wherein a voltage distribution unit includes a data voltage generation unit adapted to receive the second selection signals and the second inverse selection signals to generate a data voltage, and
wherein the switch unit includes:
a first transistor adapted to receive a first selection signal and switch the first reference voltage;
a second transistor adapted to receive a first inverse selection signal and switch the first reference voltage;
a third transistor adapted to receive the first selection signal and switch the second reference voltage; and
a fourth transistor adapted to receive the first inverse selection signal and switch the second reference voltage.

9. The data driver as claimed in claim 8, wherein the first selection unit is adapted to operate in correspondence with one bit of the digital data signal, the second selection unit is adapted to operate in correspondence with one bit of the digital data signal, and the first decoder is adapted to select two reference voltages.

10. The data driver as claimed in claim 8, wherein the data voltage generation unit includes a voltage distribution unit adapted to receive the first reference voltage and the second reference voltage to generate four grey level voltages by employing a resistance ratio.

11. The data driver as claimed in claim 8, wherein the data voltage generation unit comprises:
a fifth transistor adapted to switch the first reference voltage in correspondence with the second selection signal;
a sixth transistor adapted to switch the first reference voltage in correspondence with the second inverse selection signal;
a resistor array in which first, second, and third resistors are connected in series;
a seventh transistor connected between the first and second resistors and adapted to output a grey level voltage of the data signal in correspondence with the second selection signal; and
an eighth transistor connected between the second and third resistor and adapted to output a grey level voltage of the data signal in correspondence with the second inverse selection signal.

12. The data driver as claimed in claim 8, wherein the switch unit is adapted to select two reference voltage lines from nine reference voltage lines to select the first reference voltage and the second reference voltage.

13. An organic light emitting diode display device, comprising:
a pixel unit adapted to receive a data voltage and a scan signal to display an image;
a data driver adapted to generate the data voltage; and
a scan driver adapted to generate the scan signal,
wherein the data driver includes:
a shift register unit adapted to output control signals;
a latch unit adapted to receive digital data signals in series and output digital data signals in parallel in correspondence with the control signal; and a D/A converter unit adapted to convert a digital data signal to data voltage, wherein the D/A converter unit includes:

a first decoder adapted to output a plurality of first decoding signals employing first bits of a digital data signal;

a first selection unit adapted to generate a plurality of first selection signals and a plurality of first inverse selection signals in correspondence with a plurality of the first decoding signals;

a switch unit adapted to select a first reference voltage and second reference voltage from a plurality of reference voltages employing the first selection signals and the first inverse selection signals, the second reference voltage being lower than the first reference voltage;

a second decoder adapted to output a plurality of second decoding signals employing second bits of the digital data signal;

a second selection unit adapted to generate a plurality of second selection signals and a plurality of second inverse selection signals in correspondence with the second decoding signals; and a plurality of voltage distribution units adapted to receive and distributing the selected first reference voltage and the selected second reference voltage, wherein a voltage distribution unit includes a data voltage generation unit adapted to receive the second selection signals and the second inverse selection signals to generate a data voltage, wherein the switch unit includes:

a first transistor adapted to receive a first selection signal and switch the first reference voltage;

a second transistor adapted to receive a first inverse selection signal and switch the first reference voltage;

a third transistor adapted to receive the first selection signal and switch the second reference voltage; and a fourth transistor adapted to receive the first inverse selection signal and switch the second reference voltage.

14. The organic light emitting diode display device as claimed in claim 13, wherein the first selection unit is adapted to operate in correspondence with one bit of the digital data signal, the second selection unit is adapted to operate in correspondence with one bit of the digital data signal, and the first decoder selects two reference voltages.

15. The organic light emitting diode display device as claimed in claim 13, wherein the data voltage generation unit includes a voltage distribution unit adapted to receive the first reference voltage and the second reference voltage to generate four grey level voltages by employing a resistance ratio.

16. The organic light emitting diode display device as claimed in claim 13, wherein the data voltage generation unit comprises:

a fifth transistor adapted to switch the first reference voltage in correspondence with the second selection signal;

a sixth transistor adapted to switch the first reference voltage in correspondence with the second inverse selection signal;

a resistor array in which first, second, and third resistors are connected in series;

a seventh transistor connected between the first and second resistors and adapted to output a grey level voltage of the data signal in correspondence with the second selection signal; and an eighth transistor connected between the second and third resistor and outputting a grey level voltage of the data signal in correspondence with the second inverse selection signal.

17. The organic light emitting diode display device as claimed in claim 13, wherein the switch unit is adapted to select two reference voltage lines from nine reference voltage lines to select the first reference voltage and the second reference voltage.

* * * * *